(12) United States Patent
Chang et al.

(10) Patent No.: US 9,780,085 B1
(45) Date of Patent: Oct. 3, 2017

(54) ELECTROSTATIC DISCHARGE PROTECTION APPARATUS

(71) Applicant: Novatek Microelectronics Corp., Hsinchu (TW)

(72) Inventors: Rong-Kun Chang, Taichung (TW); Jie-Ting Chen, Yilan (TW); Chun-Yu Lin, Hsinchu (TW); Ming-Dou Ker, Hsinchu (TW); Tzu-Chien Tzeng, Hsinchu (TW); Ping-Chang Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/373,491

(22) Filed: Dec. 9, 2016

(51) Int. Cl.
*H01L 27/02* (2006.01)
*H01L 49/02* (2006.01)

(52) U.S. Cl.
CPC ...... *H01L 27/0292* (2013.01); *H01L 27/0255* (2013.01); *H01L 27/0262* (2013.01); *H01L 27/0288* (2013.01); *H01L 28/10* (2013.01)

(58) Field of Classification Search
CPC ........ H01L 23/60–23/62; H01L 23/645; H01L 23/66; H01L 27/0292; H01L 27/0288; H01L 27/0262; H01L 27/0255; H01L 28/10
See application file for complete search history.

(56) References Cited

U.S. PATENT DOCUMENTS

| 5,969,929 A | 10/1999 | Kleveland et al. |
| 2006/0256489 A1* | 11/2006 | Ker ..................... H01L 27/0255 361/56 |

OTHER PUBLICATIONS

Ito et al., "Analysis and design of distributed ESD protection circuits for high-speed mixed-signal and RF ICs," IEEE Transactions on Electron Devices, Aug. 7, 2002, pp. 1444-1454.
Ker et al., "Decreasing-Size Distributed ESD Protection Scheme for Broad-Band RF Circuits," IEEE Transactions on Microwave Theory and Techniques, Feb. 2005, pp. 582-589.
Lin et al., "Self-matched ESD cell in CMOS technology for 60-GHz broadband RF applications," IEEE Radio Frequency Integrated Circuits Symposium (RFIC), May 23-25, 2010, pp. 573-576.
Ker et al., "Optimization of broadband RF performance and ESD robustness by π-model distributed ESD protection scheme," Journal of Electrostatics, Feb. 2006, pp. 80-87.

\* cited by examiner

*Primary Examiner* — Roy Potter
*Assistant Examiner* — Paul Patton
(74) *Attorney, Agent, or Firm* — Jianq Chyun IP Office

(57) ABSTRACT

An electronic static discharge protection apparatus provided. A plurality of ESD circuits serially coupled between a pad and a internal circuit, a first stage ESD circuit includes a ESD element directly coupled to the pad, and a last stage ESD circuit includes an inductive element directly coupled to the internal circuit, so as to improve electronic discharge protecting ability of the ESD protection apparatus and increase circuit operation bandwidth without signal loss attenuation.

7 Claims, 6 Drawing Sheets

ELECTROSTATIC DISCHARGE PROTECTION APPARATUS

FIELD OF INVENTION

The invention relates to a protection apparatus; more particularly, the invention relates to an electronic discharge (ESD) protection apparatus.

DESCRIPTION OF RELATED ART

In order to increase the bandwidth of high-speed circuits, electrostatic discharge (ESD) protection elements are designed to be divided into many small units and separated by inductors (or transmission lines). The distributed electrostatic discharge protection design can effectively discharge electrostatic charges by utilizing its multi-level structure, and thus to effectively achieve the purpose of protecting circuit form damage. In order to reduce the impact of the protection circuit on a internal circuit, the matching design of ESD protection circuit must be done to provide effective protection and reduce impact on the internal circuit.

FIG. 1 illustrates a conventional distributed ESD protection circuit. The ESD protection circuit includes a pad 112, two inductive components 114 and 115, two ESD elements 120 and 121, and an internal circuit 118. Each stage of the distributed ESD protection circuits formed by an inductive component and an ESD element (for example, the inductive component 114 and the ESD element 120 form a first stage distributed ESD protection circuit). FIG. 2 is a Smith chart of the conventional distributed ESD protection circuit shown in FIG. 1. As shown in FIG. 2, each stage matching of the distributed ESD protection circuits brings the route back to a real axis of the Smith Chart, such that an influence caused by parasitic effect is reduced. Although the conventional distributed ESD protection circuit is capable of reducing the parasitic effect caused by the ESD elements 120 and 121, the first component coupled to the pad 112 is the inductive component 114, which is disadvantageous for removal of electrostatic charges. In addition, damage to the internal circuit cannot be prevent because of the lack of disposing positive impedance component close to the internal circuit.

SUMMARY OF THE INVENTION

The invention is directed to an ESD protection apparatus, so as to effectively improve electronic discharge protecting ability of the ESD protection apparatus and increase circuit operation bandwidth.

In an embodiment of the invention, a ESD protection apparatus connected between a pad and an internal circuit is provided. The internal circuit receives an input signal through the pad. The ESD protection apparatus includes a distributed ESD circuit including a plurality of ESD circuits. The ESD circuits are serially coupled between the pad and the internal circuit. A first stage ESD circuit includes a first ESD element directly coupled to the pad, and a last stage ESD circuit includes a first inductive element directly coupled to the internal circuit.

According to an embodiment of the invention, a first terminal of the first ESD element of a first stage ESD circuit is directly coupled to the pad, a second terminal of the first ESD element of the first stage ESD circuit is coupled to a ground, and the first stage ESD circuit further includes a second inductive element having a first terminal coupled to the first terminal of the first ESD element and a second terminal coupled to an input terminal of a next stage ESD circuit.

According to an embodiment of the invention, the last stage ESD circuit further includes a second ESD element having a first terminal coupled to an output terminal of a former stage ESD circuit and a second terminal coupled to a ground, and a first terminal of the first inductive element is coupled to the first terminal of the second ESD element and a second terminal directly coupled to the internal circuit.

According to an embodiment of the invention, each of the ESD circuits coupled between two ESD circuits includes an second ESD element and an second inductive element. The second ESD element has a first terminal coupled to an output terminal of a former stage ESD circuit and a second terminal coupled to a ground. The second inductive element has a first terminal coupled to the first terminal of the second ESD element and a second terminal coupled to an input terminal of a next stage ESD circuit.

According to an embodiment of the invention, the first ESD element is disposed under the pad.

According to an embodiment of the invention, the first ESD element includes a capacitor, a diode or silicon controlled rectifier.

According to an embodiment of the invention, the first inductive element includes a transmission line or an inductor.

In view of the above, the first ESD element of the first stage ESD circuit is directly coupled to the pad and the first inductive element of the last stage ESD circuit is directly coupled to the internal circuit, so as to improve electronic discharge protecting ability of the ESD protection apparatus and increase circuit operation bandwidth.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain the principles of the invention.

DETAILED DESCRIPTION OF DISCLOSED EMBODIMENTS

Figure 1:
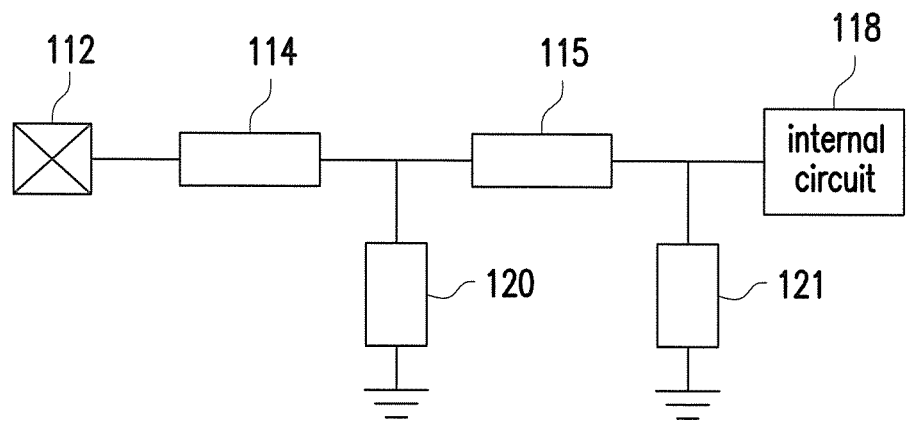
FIG. 1 illustrates a conventional distributed ESD protection circuit.
Figure 2:
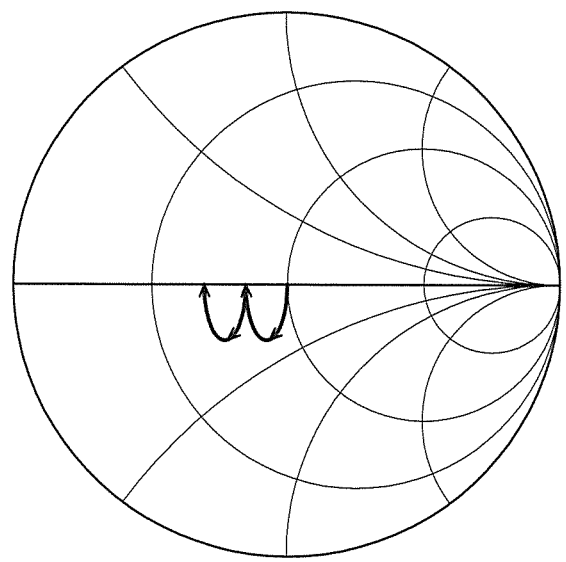
FIG. 2 is a Smith chart of the conventional distributed ESD protection circuit shown in FIG. 1.
Figure 3:
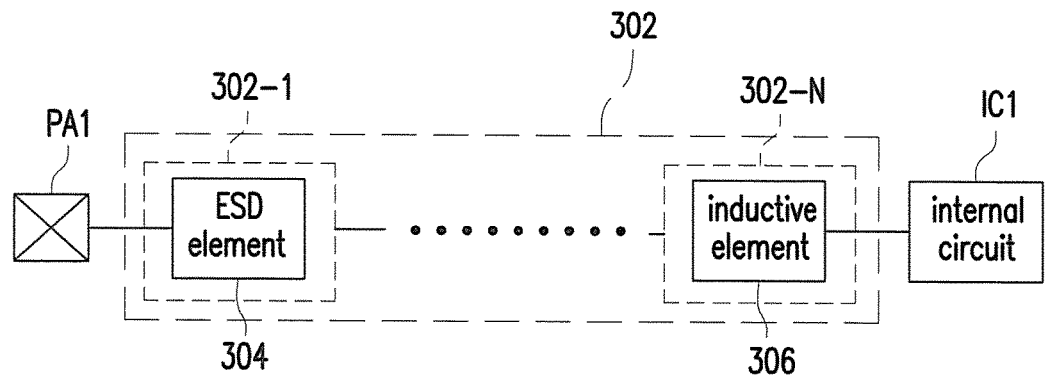
FIG. 3 is a schematic view illustrating an ESD protection apparatus according to an embodiment of the invention.

FIG. 3 is a schematic view illustrating an ESD protection apparatus according to an embodiment of the invention. The ESD protection apparatus includes a distributed ESD circuit 302 including a plurality of ESD circuits 302-1-302-N, where N is a positive integer. The ESD circuits 302-1-302-N are serially coupled between a pad P1 and an internal circuit IC1, the internal circuit IC1 receives an input signal through the pad P1. In more detail, the first stage ESD circuit 302-1 includes an ESD element 304 directly coupled to the pad P1, and the Nth stage ESD circuit 302-N includes an inductive element 306 directly coupled to the internal circuit IC1, the ESD element 304 may be implemented by a capacitor, a diode or silicon controlled rectifier, and the inductive element 306 may be implemented by transmission line or an inductor, the invention is not limited thereto. In this way, by disposing the ESD element 304 directly coupled to the pad P1, the ESD element 304 can immediately discharges electrostatic charges generated on the pad P1, and thus the electronic discharge protecting ability of the ESD protection apparatus is effectively improved. On the other hand, by disposing the inductive element 306 directly coupled to the internal circuit IC1 which having positive impedance can prevent the internal circuit IC1 from being damaged by electronic currents and adjust the effective impedance of the ESD protection apparatus to match 50 ohm.

Figure 4:
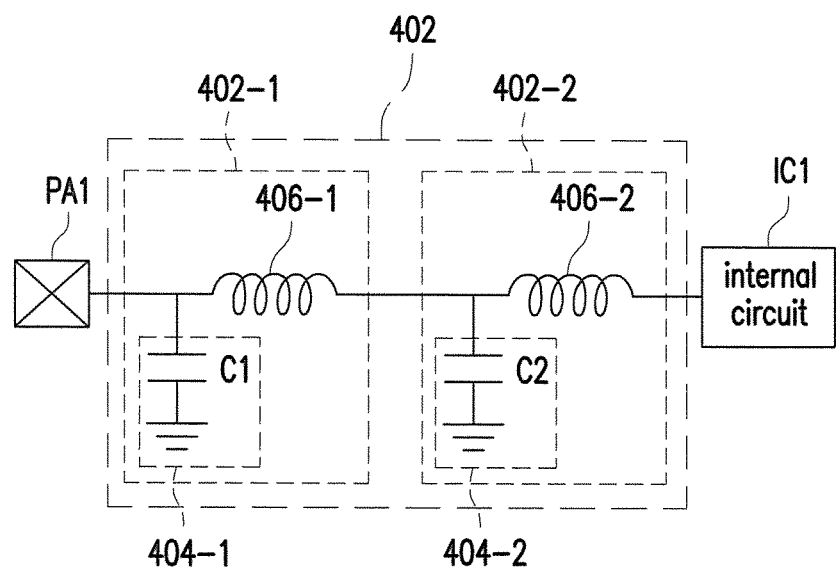
FIG. 4 is a schematic view illustrating an ESD protection apparatus according to another embodiment of the invention.

FIG. 4 is a schematic view illustrating an ESD protection apparatus according to another embodiment of the invention. In the present embodiment, ESD protection apparatus includes a distributed ESD circuit 402 including two ESD circuits 402-1 and 402-2 serially coupled between a pad P1 and an internal circuit IC1, each of the ESD circuits 402-1 and 402-2 includes an ESD element and an inductive element. As shown in FIG. 3, the first stage ESD circuits 402-1 includes an ESD element 404-1 and an inductive element 406-1, and the second stage ESD circuits 402-2 includes an ESD element 404-2 and an inductive element 406-2. The ESD element 404-1 is coupled between the pad P1 and a ground, the inductive element 406-1 is coupled between the pad P1 and the second stage ESD circuits 402-2, the ESD element 404-2 is coupled between the first stage ESD circuits 402-1 and the ground, and the inductive element 406-2 is coupled between the first stage ESD circuits 402-1 and the internal circuit IC1. The ESD element 404-1 and 404-2 are respectively implemented by a capacitor C1 and C2 in the present embodiment, but are not limited thereto, the inductive element 406-1 and 406-2 are respectively implemented by transmission lines in the present embodiment, but also are not limited thereto.

Figure 5:
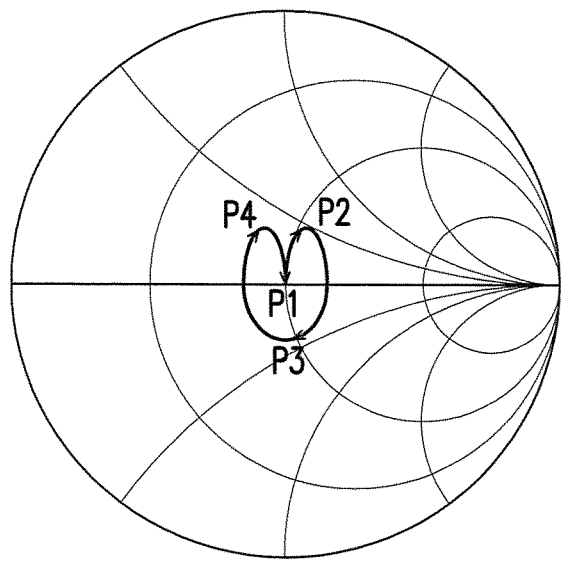
FIG. 5 is a Smith chart of the ESD protection apparatus of FIG. 4.

FIG. 5 is a Smith chart of the ESD protection apparatus of FIG. 4. As shown in FIG. 5, the route begins at the origin P1 of the Smith chart, the inductive element 406-2 leads the route up to a point P2 following the circle in the Smith chart. The ESD element 404-2 leads the route from point P2 down to a point P3 in the smith chart. The inductive element 406-1 leads the route form point P3 up to a point P4 following the circle in the Smith chart, and the ESD element 404-1 brings the route back to 50 ohm (the origin P1) in the smith chart, so as to optimize the transmission effect of the ESD protection apparatus. In addition, the electronic discharge protecting ability of the ESD protection apparatus is improved benefit from the disposition of the ESD element 404-1 close to the pad PA1, and the internal circuit IC is prevented from being damaged by electronic currents because of the inductive element 406-2 directly coupled to the internal circuit IC1.

Figure 6:
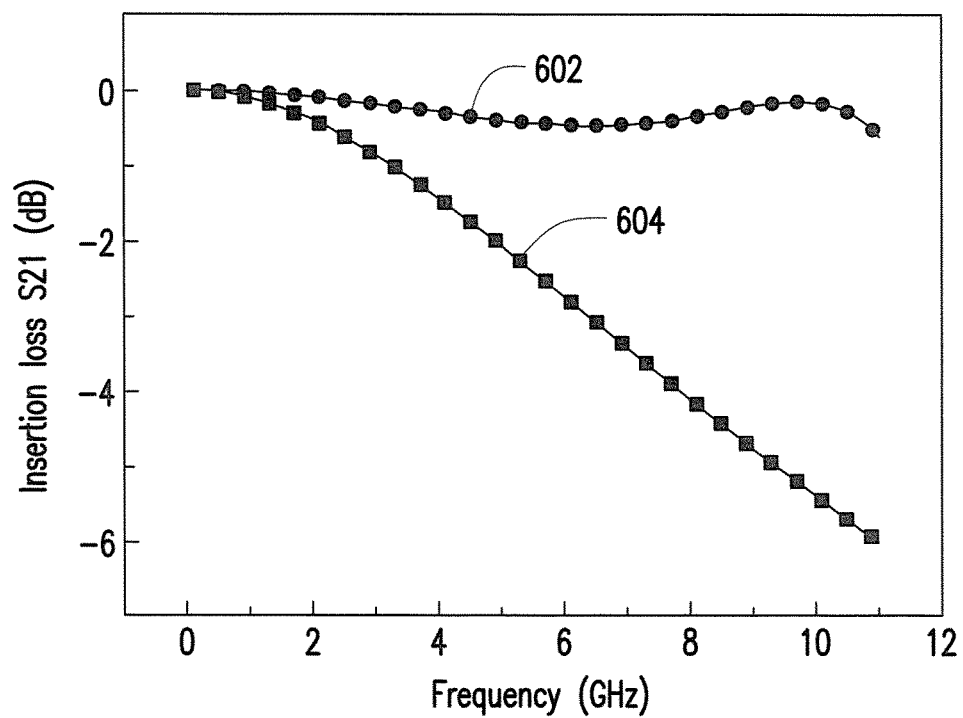
FIG. 6 is a schematic view illustrating frequency response diagram of insertion loss according to the embodiment of FIG. 4 of the invention.

FIG. 6 is a schematic view illustrating frequency response diagram of insertion loss according to the embodiment of FIG. 4 of the invention. The characteristics of the insertion loss coefficient S21 of the ESD protection apparatus of FIG. 3 is represented by curve 602, and the characteristics of the insertion loss coefficient S21 without inductive elements 406-1 and 406-2 in the ESD protection apparatus of FIG. 3 is represented by curve 604. In present embodiment, the sum of the capacitance values of the capacitors C1 and C2 is 1 fF. As shown in FIG. 6, by matching the effective impedance of the ESD protection apparatus to 50 ohm with inductive elements, the insertion loss coefficient S21 of the ESD protection apparatus of FIG. 3 does not decrease with frequency increase and is maintained at −1 dB or higher. By contrast, the curve 604 goes down with frequency increase, the insertion loss coefficient S21 of the curve 604 declines to −6 dB at 10 GHz. That is, the ESD circuits 402-1 and 402-2 of the present embodiment will not influence the signal transmission between the pad PA1 and the internal circuit IC1 and is capable of providing effective ESD protection.

Figure 7:
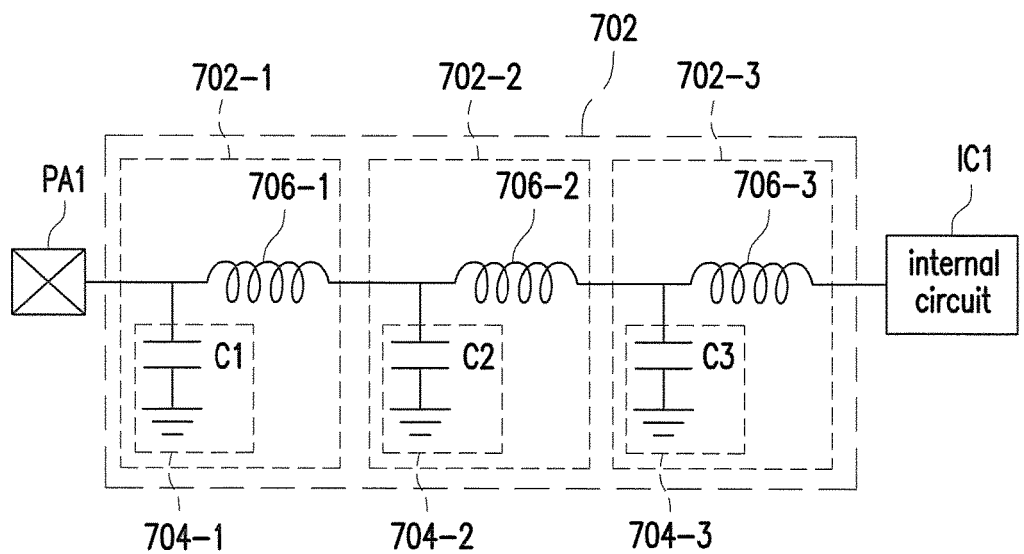
FIG. 7 is a schematic view illustrating an ESD protection apparatus according to another embodiment of the invention.
Figure 8:
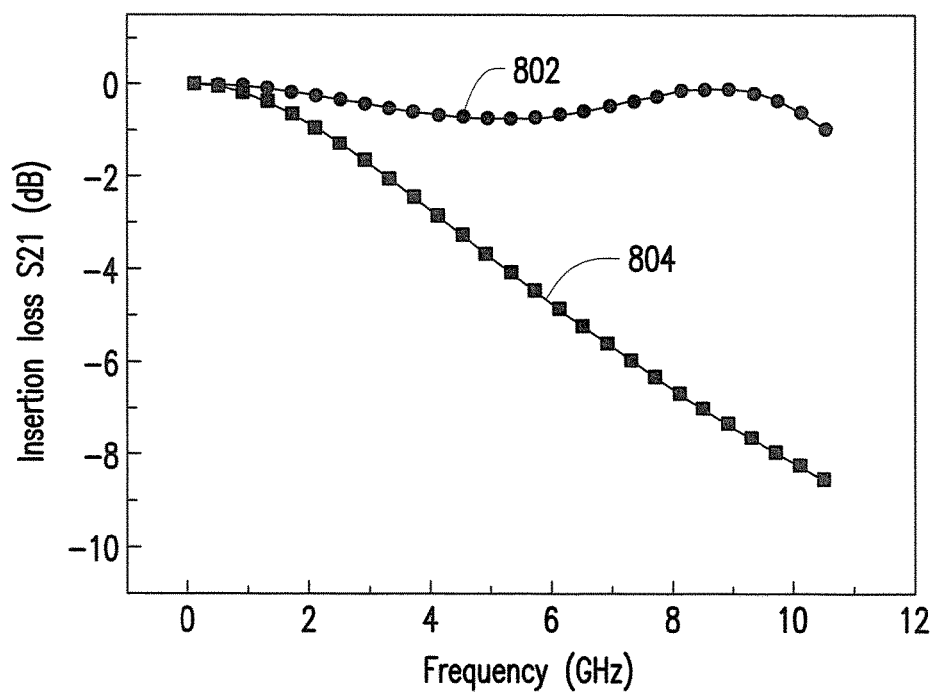
FIG. 8 is a schematic view illustrating frequency response diagram of insertion loss according to the embodiment of FIG. 7 of the invention.

Note that the number of the ESD circuits are not limited to the embodiment of the FIG. 4, in some embodiments, the ESD protection apparatus may includes more ESD circuits. For example, FIG. 7 is a schematic view illustrating an ESD protection apparatus according to another embodiment of the invention. In the present embodiment, the ESD protection apparatus includes a distributed ESD circuit 702 including three ESD circuits 702-1, 702-2 and 702-3, implement of each of the ESD circuits 702-1, 702-2 and 702-3 is similar to the ESD circuits of the embodiment of FIG. 4. The ESD circuits 702-1 includes an ESD element 704-1 and an inductive element 706-1, the ESD circuits 702-2 includes an ESD element 704-2 and an inductive element 706-2, and the ESD circuits 702-3 includes an ESD element 704-3 and an inductive element 706-3. The ESD elements 704-1, 704-2 and 704-3 are respectively implemented by capacitors C1, C2 and C3, and the inductive elements 706-1, 706-2 and 706-3 may be implemented by transmission line, the invention is not limited thereto. FIG. 8 is a schematic view illustrating frequency response diagram of insertion loss according to the embodiment of FIG. 7. The characteristics of the insertion loss coefficient S21 of the ESD protection apparatus of FIG. 7 is represented by curve 802, and the characteristics of the insertion loss coefficient S21 without inductive elements 706-1, 706-2 and 706-3 in the ESD protection apparatus of FIG. 7 is represented by curve 804, in the present embodiment, the sum of the capacitance values of the capacitors C1, C2 and C3 is 1.5 fF. As shown in FIG. 8, the insertion loss coefficient S21 of the ESD protection apparatus of FIG. 7 does not decrease with frequency increase and is maintained at −1 dB or higher. By contrast, the curve 804 goes down with frequency increase, the insertion loss coefficient S21 of the curve 604 declines to −8 dB at 10 GHz. That is, with the number of the ESD circuits increases, signal loss between the pad PA1 and the internal circuit IC1 can still be avoided.

Figure 9:
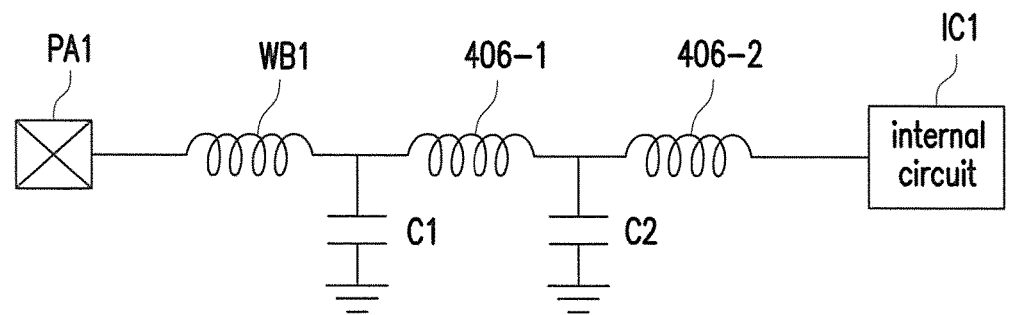
FIG. 9 is a schematic view illustrating an ESD protection apparatus according to another embodiment of the invention.
Figure 10:
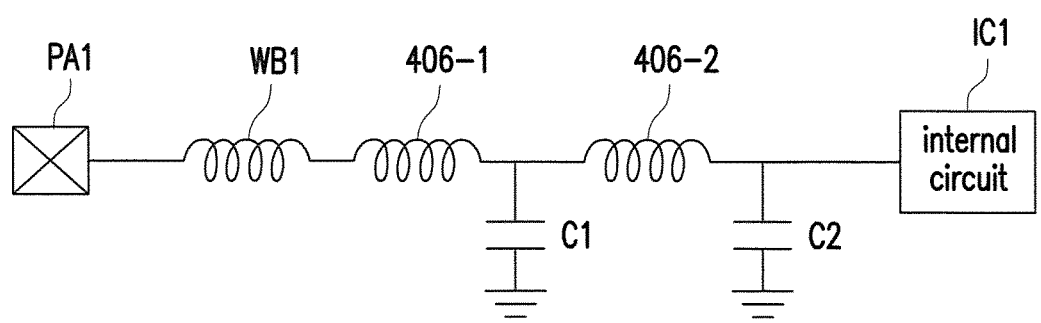
FIG. 10 is a schematic view illustrating an ESD protection apparatus according to another embodiment of the invention.
Figure 11:
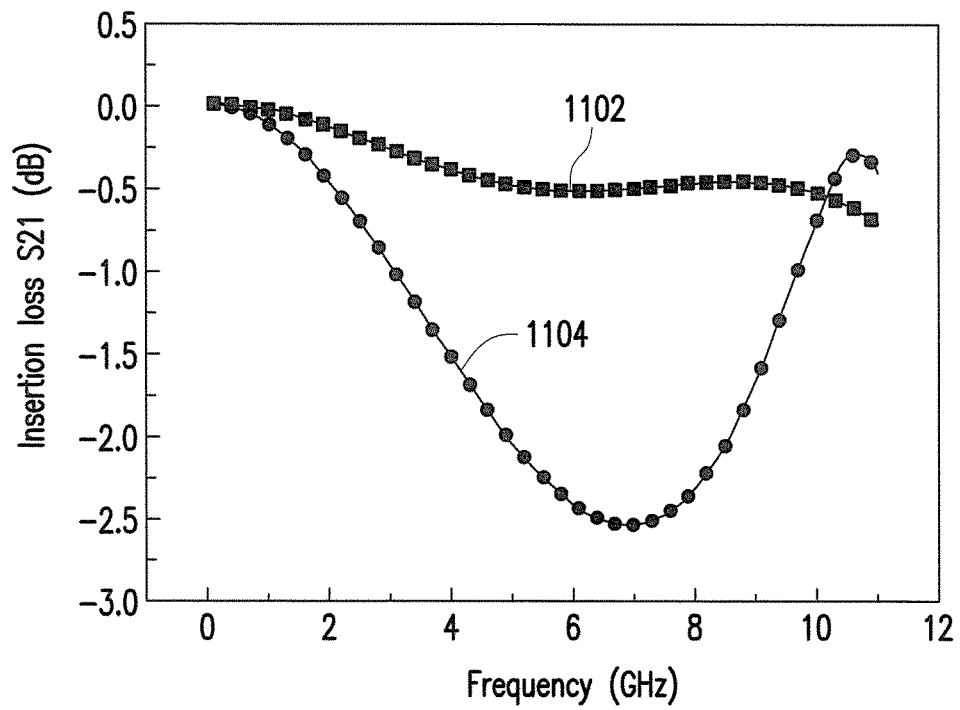
FIG. 11 is a schematic view illustrating frequency response diagram of insertion loss according to the ESD protection apparatus of FIGS. 9 and 10.

FIG. 9 is a schematic view illustrating an ESD protection apparatus according to another embodiment of the invention. The difference between the embodiment depicted in FIG. 4 and the present embodiment lies in that the ESD protection apparatus of the present embodiment further includes an inductive element WB1 coupled between the pad PA and the inductive element 406-1, the inductive element WB1 is formed due to wire bonding. FIG. 10 is a schematic view illustrating an ESD protection apparatus according to another embodiment of the invention. The difference between the embodiment depicted in FIG. 9 and the present embodiment lies in that the capacitor C1 is coupled between the ground and the common node of the inductive elements 406-1 and 406-2, and the capacitor C2 is coupled between the ground and the common node of the inductive element 406-2 and the internal circuit IC1. FIG. 11 is a schematic view illustrating frequency response diagram of insertion loss according to the ESD protection apparatus of FIGS. 9 and 10. The characteristics of the insertion loss coefficient S21 of the ESD protection apparatus of FIG. 9 is represented by curve 1102, and the characteristics of the insertion loss coefficient S21 of the ESD protection apparatus of FIG. 10 is represented by curve 1104. As shown in FIG. 11, by matching the effective impedance of the ESD protection apparatus to 50 ohm with inductive elements, even with the additional inductive element WB1 coupled between the pad PA1 and the inductive element 406-1, the insertion loss coefficient S21 can be at least maintained at −1 dB or higher with frequency increase. That is, signal transmission between the pad PA1 and the internal circuit IC1 can still not be affected. By contrast, the curve 1104 declines to −2.5 dB at 7 GHz, which represents serious signal attenuation.

Figure 12:
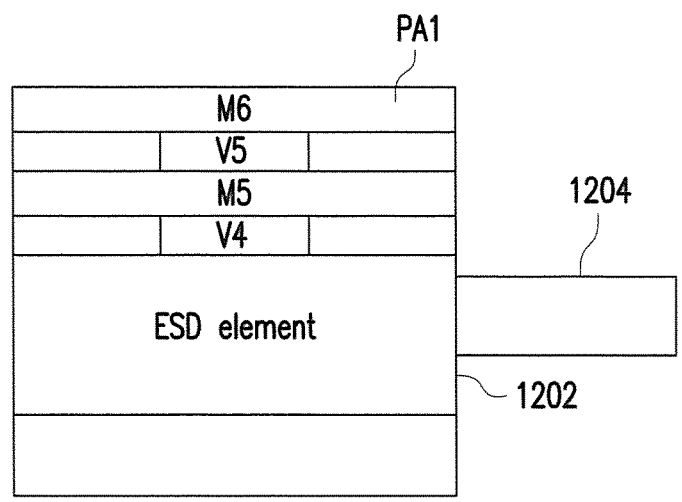
FIG. 12 is a schematic view illustrating configuration of an ESD element according to an embodiment of the invention.

FIG. 12 is a schematic view illustrating configuration of an ESD element according to an embodiment of the invention. As described above, since the element of the first stage ESD circuit connected to the pad PA1 is the ESD element, in some embodiment, when there is room for the ESD element under the pad PA1, the ESD element can be disposed under the pad PA1 to reduce circuit area. For example, in FIG. 12, a metal layer M6 is used as the pad PA1 in the present embodiment, and an ESD element 1202 is disposed under the pad PA1. In more detail, in the present embodiment, the metal layer M6 (pad PA1) connects the ESD element 1202 through a via structure V5, metal layer M5 and a via structure V4, and the ESD element 1202 further connects to the next stage circuit through a transmission line 1204.

To sum up, in the embodiments of the invention, the ESD element of the first stage ESD circuit is directly coupled to the pad and the inductive element of the last stage ESD circuit is directly coupled to the internal circuit, so as to improve electronic discharge protecting ability of the ESD protection apparatus and increase circuit operation bandwidth without signal loss attenuation. In some embodiment, the ESD element of the first stage distributed ESD directly coupled to the pad may be disposed under the pad, so as to reduce circuit area.

What is claimed is:

1. An electronic static discharge (ESD) protection apparatus, connected between a pad and an internal circuit, wherein the internal circuit receives an input signal through the pad, the electronic static discharge protection apparatus comprising:
   a distributed ESD circuit, comprising:
      a plurality of ESD circuits, serially coupled between the pad and the internal circuit, wherein a first stage ESD circuit comprises a first ESD element directly coupled to the pad, and a last stage ESD circuit comprises a first inductive element directly coupled to the internal circuit.

2. The electronic static discharge protection apparatus of claim 1, wherein a first terminal of the first ESD element of a first stage ESD circuit is directly coupled to the pad, a second terminal of the first ESD element of the first stage ESD circuit is coupled to a ground, and the first stage ESD circuit further comprises a second inductive element having a first terminal coupled to the first terminal of the first ESD element and a second terminal coupled to an input terminal of a next stage ESD circuit.

3. The electronic static discharge protection apparatus of claim 1, wherein the last stage ESD circuit further comprises a second ESD element having a first terminal coupled to an output terminal of a former stage ESD circuit and a second terminal coupled to a ground, and a first terminal of the first inductive element is coupled to the first terminal of the second ESD element and a second terminal directly coupled to the internal circuit.

4. The electronic static discharge protection apparatus of claim 1, wherein each of the ESD circuits coupled between two ESD circuits comprises:
   an second ESD element, having a first terminal coupled to an output terminal of a former stage ESD circuit and a second terminal coupled to a ground; and
   an second inductive element having a first terminal coupled to the first terminal of the second ESD element and a second terminal coupled to an input terminal of a next stage ESD circuit.

5. The electronic static discharge protection apparatus of claim 1, wherein the first ESD element is disposed under the pad.

6. The electronic static discharge protection apparatus of claim 1, wherein the first ESD element comprises a capacitor, a diode or silicon controlled rectifier.

7. The electronic static discharge protection apparatus of claim 1, wherein the first inductive element comprises a transmission line or an inductor.

* * * * *